United States Patent [19]

Keren

[11] Patent Number: 4,928,064
[45] Date of Patent: May 22, 1990

[54] HYBRID SURFACE COILS

[75] Inventor: Hanan Keren, Kfar Saba, Israel

[73] Assignee: Elscint Ltd., Haifa, Israel

[21] Appl. No.: 321,299

[22] Filed: Mar. 10, 1989

[30] Foreign Application Priority Data

Mar. 18, 1988 [IL] Israel .......................................... 85786

[51] Int. Cl.⁵ ............................................. G01R 33/20
[52] U.S. Cl. ....................................... 324/322; 324/318
[58] Field of Search ....................... 324/307, 318, 322; 343/742, 867

[56] References Cited

U.S. PATENT DOCUMENTS

| 4,691,163 | 9/1987 | Blass et al. | 324/318 |
| 4,746,866 | 5/1988 | Röschmann | 324/322 |
| 4,816,765 | 3/1989 | Boskamp | 324/322 |

Primary Examiner—Hezron E. Williams
Assistant Examiner—Kevin O'Shea
Attorney, Agent, or Firm—Sandler, Greenblum & Bernstein

[57] ABSTRACT

A surface coil for use in MRI data acquisition systems wherein the surface coil has the capability of operating as a quadrature coil and of supporting two independent current moles enabling tuning to two separate frequencies.

9 Claims, 3 Drawing Sheets

HYBRID SURFACE COILS

FIELD OF THE INVENTION

This invention is concerned with magnetic resonance (MR) studies for imaging or spectroscopy and more particularly to the radio frequency (RF) surface coils or probes used in such (MR) procedures.

BACKGROUND OF THE INVENTION

Originally the magnetic resonance phenomena was utilized to study the molecular structural of organic molecules in-vitro. This was in the field of NMR spectroscopy. Typically the magnetic resonance spectrometers utilized for spectroscopy were designed to accommodate relatively small samples of the substances being studied. In the relatively recent past, however, magnetic resonance has been used for medical diagnostic imaging. Using magnetic resonance methods tomographic images have been obtained of the interior of live human subjects. Such images generally detect parameters associated with "nuclear spins". Nuclear spins are typically hydrogen protons associated with water in tissue. However, the NMR techniques have also been extended to in-vivo spectroscopy of such elements as phosphorous, sodium and carbon, for example. This provides researchers with efficient tools for the first time enabling the study of chemical processes in vivo. The use of magnetic resonance to produce images and to produce spectroscopic studies of the human body has necessitated the use of specifically designed radio frequency coils or probes.

As is well known, magnetic resonance occurs in nuclei that have an odd number of protons and/or neutrons. Since protons and neutrons spin about the axis, each such nuclei that has an odd number of protons or neutrons exhibits magnetic moment. When such nuclei ("spins") are placed in a large static homogeneous magnetic field Bo, to a statistical majority of the nuclear magnetic moments align with the field to produce a macroscopic magnetisation in the direction of the large static magnetic field. Under the influence of the large magnetic field Bo, the magnetic moments precess about the axis of the field at a frequency which is dependent on the strength of the applied magnetic field and on the characteristics of the nuclei. The angular precession frequency, fo is also referred to as the Larmor frequency and is given by the equation: $fo = \gamma B/2\pi$;
wherein:

$\gamma$ is the gyromagnetic ratio (a constant for each NMR isotope);
B is the magnetic field (Bo plus other fields) acting upon the nuclear spins; and
$\pi$ is the well known constant 3.1416+.

From this equation it is apparent that the resonant frequency is dependent on both the strength of the magnetic field and the particular isotopes included in the sample being studied.

The density of the spins or the spectrographic response of the spins is determined by perturbing or "tipping" the spins into a transverse plane or such that a component of the spins appear in the transverse plane, i.e. the plane normal to the axis of the large static homogeneous magnetic field. The spins are tipped by the application of radio frequency (RF) magnetic fields that oscillate at or near the Larmor frequency. The RF magnetic fields are applied orthogonal to the direction of magnetization of the large static magnetic field and by means of radio frequency pulses transmitted through RF coils connected to radio frequency transmitting apparatus. The spins so tipped tend to lose the energy that was supplied by the RF field and revert to the former alignment. As they revert they generate RF signals either in special receiving coils or in the same coils which transmitted the RF pulses that caused the spins to tip. Naturally, the signals which are known as free induction decay (FID) signals are very small and everything possible is done to enhance the signal-to-noise (SNR) ratio of those signals.

When the whole body is imaged to obtain a tomographic section of the whole body then what are known as body coils are used for both transmitting RF pulses and receiving the RF signals. The body coils are large coils that surround the patient's entirely.

Many times only portions of the body are imaged. For example, if the image is done on the spine or if the image is done one of the limbs, then what are known as surface coils are used. The surface coils are used primarily to detect the FID signals responsive to RF pulses applied through a body coil. The advantage of surface coils is that they can be applied or situated immediately adjacent or juxtaposed to the portion of the body being imaged. This proximate positioning, of course, increases the signal-to-noise ratio.

Another method of increasing the signal-to-noise ratio is by through the use of what are known as quadrature coils. Quadrature coils have inductive receiving portions separated by 90 degrees. Such coils can be thought of as utilizing a rotating field wherein the angular rotation of the field can be set to synchronize with the precessing frequency.

When data from protons are being acquired, then a resonant or Larmor frequency is used based on the Larmor frequency equation discussed above. For example in a 1.9 Tesla field, the magnetic resonance frequency of protons is 81 MHz. For spectroscopic studies different resonance frequencies are required to resonate such elements as phosphorous, sodium or carbon. The resonant frequencies for those elements are 33 MHz for phosphorous and approximately 21 MHz for both sodium and carbon.

In the past different coils have been used for detecting the resonant frequencies of the different elements. However, recently a patent (U.S. Pat. No. 4,691,163) was issued to the Assignee of this Application covering a surface coil capable of resonating at more than one frequency. Such a feature is very desirable in magnetic resonance systems because among other things the same coil can be used both for imaging and for spectroscopic studies.

An object of this invention is to provide RF coils that can be used not only for detecting resonance at more than one frequency, but also for effectively detecting signals in either quadrature or linear modes.

BRIEF DESCRIPTION OF THE INVENTION

In accordance with the present invention, a surface coil for use in magnetic resonance (MR) systems is provided, said surface coil comprising:
a first loop,
said first loop comprising: first and second longitudinal substantially parallel conductors,
a pair of transverse conductors coupled to the first and second longitudinal conductors at opposite ends thereof to form said first loop, first capacitor means in the first loop for tuning and matching the first loop to a first desired resonant frequency and to the system impedance, second and third loops comprising:

a third longitudinal conductor connected between substantially equal voltage points on said pair of transverse conductors to thereby provide said second and third loops, and second capacitor means for tuning and matching said second and third loops to a second desired resonant frequency and to the system impedance.

A feature of the present invention is the capability of the surface coil to support two independent current modes on the same coil. This feature enables the coil to be tuned to two separate frequencies, for example, 81 MHz and 33 MHz or 21 MHZ.

A further feature of the invention comprises means for coupling the surface coil to hybrid combiner means when the coil is used for proton imaging only and as a quadrature surface coil.

Separate means are provided for coupling together the first loop, the second and third loops of the basic inventive coil when the coil is used as a linear surface coil for acquiring data on proton isotopes. The separate means does not include a hybrid combiner. Instead appropriate lengths of coaxial cable are joined together at a common point to provide the proper impedance matching and tuning for the independent loops of the surface coil.

BRIEF DESCRIPTION OF THE DRAWINGS

The above mentioned and other features and objects of the present invention will be best understood when considered in the light of the following description of the invention made in conjunction with the accompanying drawings, wherein.

GENERAL DESCRIPTION

Figure 1:
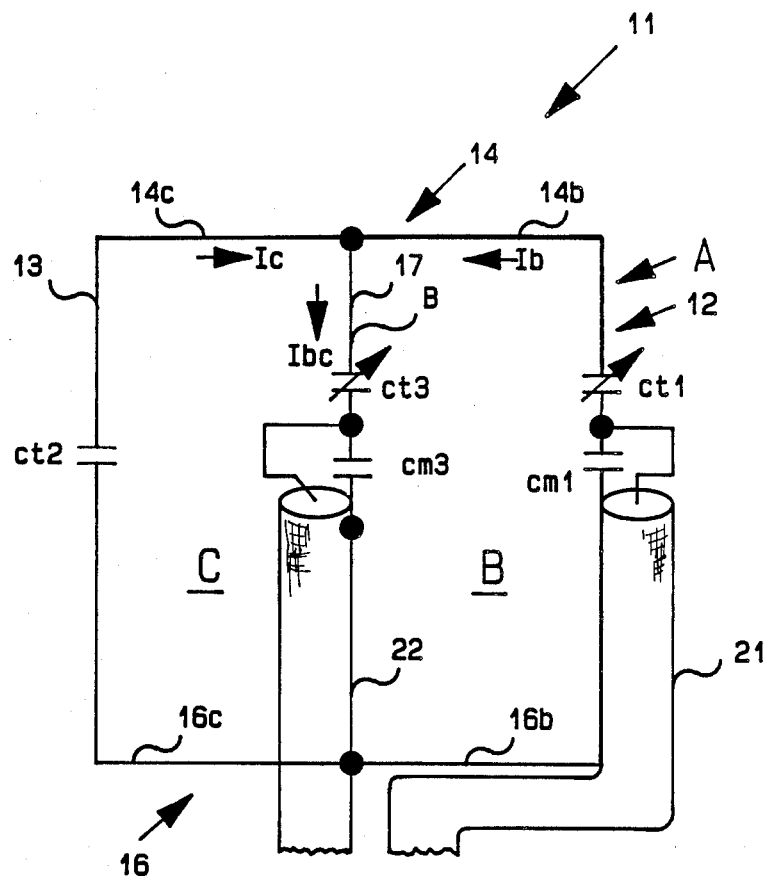
FIG. 1 is a schematic showing of the basic inventive surface coil.

FIG. 1 at 11 shows the basic inventive surface coil arrangement. The basic coil arrangement comprises a first loop A that is comprised of a pair of spaced apart longitudinal conductors 12 and 13. The longitudinal conductors are joined together by spaced apart transverse conductors 14 and 16. The conductor 12 has serially connected therein a tuning capacitor CT1 and a matching capacitor CM1. The longitudinal conductor 13 is shown with a supplemental capacitor CT2 serially connected therein for use in tuning. It should be noted that in any case only one of the capacitors CT1 and CT2 needs to be a variable capacitor. In FIG. 1 capacitor CT1 is shown as being variable. However, CT2 can also be variable within the scope of the invention.

The basic coil system also includes a second and third loop. The second loop is comprised of a third longitudinal conductor 17 located between and substantially parallel to the longitudinal conductors 12 and 13. The third longitudinal conductor 13 also includes serially connected capacitor means. The capacitor means includes a tuning capacitor shown as CT3 and a matching capacitor shown as CM3.

The second loop B comprises conductors 12, 14B, 17 and 16B along with the serially coupled circuit elements. The third loop C comprises conductors 13, 14c, 17, and 16C along with the serially coupled circuit elements.

The current flowing in loop A is independent of the current flowing through the conductor 17. The current flowing through conductor 17 is shown as IBC. It is made up of the currents IB and IC flowing through loops B and C. Both currents IB and IC enter 17 and flow as current IBC. The current generated in loop A does not flow in loop B when the coil is used for detecting signals from different elements. For example, when loop A is tuned for detecting proton signals and loops B and C are tuned for detecting phosphorous, sodium or carbon signals. Then the signals generated by protons resonate loop A but not loops B or C. Whereas, if the signals were generated by one of the other lower frequency elements: sodium, carbon or phosporous, then loops B and C would be resonated.

Alternatively, the surface coil could be used as a quadrature surface coil, by properly coupling the surface coil to the system. Basically the surface coil of FIG. 1 is preferably connected to the system through a pair of coaxial cables shown as coaxial cables 21 and 22. Coaxial cable 21 is shown as having a center conductor connected to the junction of capacitors CT1 and CM1 and having a shield connected at the opposite side of the matching capacitor CM1.

Coaxial cable 22 is similarly connected with its central conductor coupled between the junction of tuning capacitor CT3 and the matching capacitor CM3. The shielding of coaxial cable 22 is coupled to the other side of matching capacitor CM3. RF probe 11 can be used for responding to proton signals or lower frequency signals from other elements. The probe can also be used as a linear surface coil or a quadrature surface coil.

Figure 2:
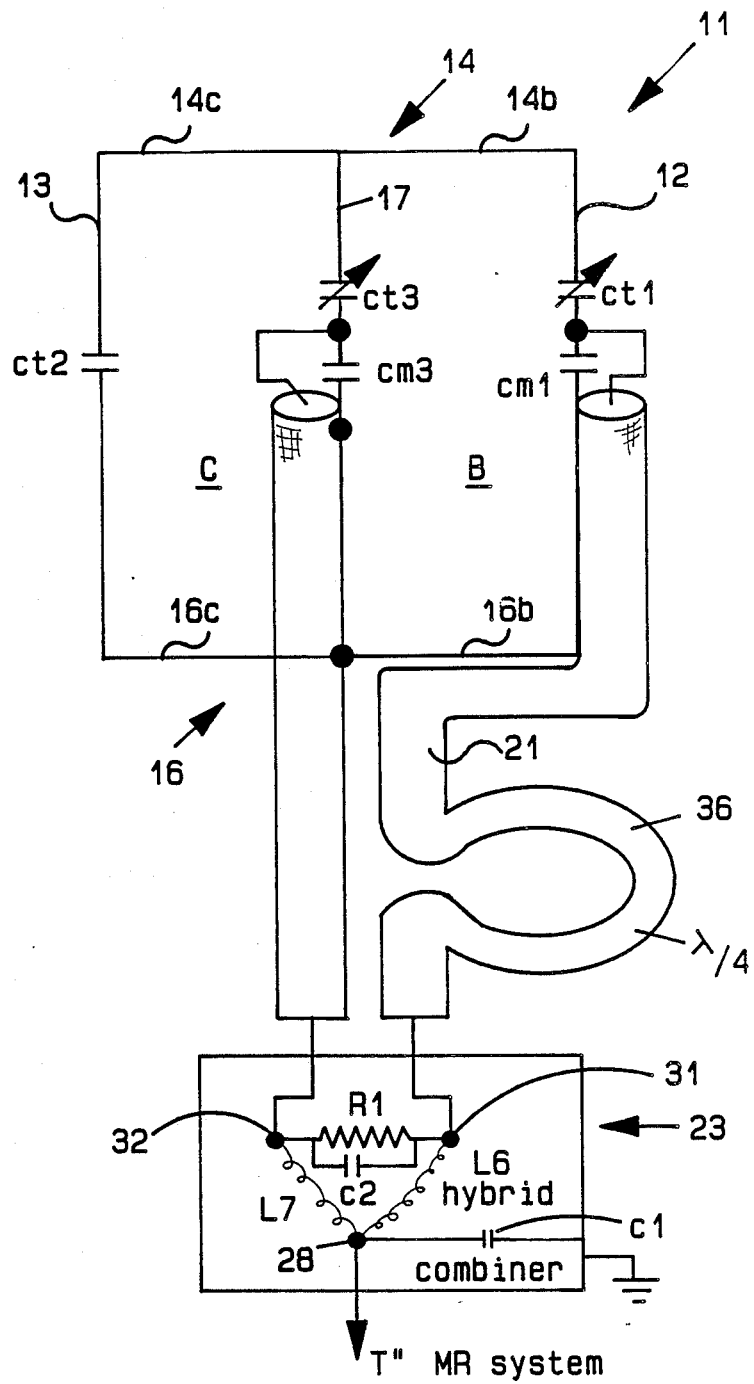
FIG. 2 is a schematic showing of the surface coil connected to an MR system through a hybrid combiner.

FIG. 2 shows connection of the coil 11 when used for proton imaging only, as a quadrature surface coil. Therein the coaxial cables 21 and 22 are shown coupled to a hybrid combiner 23. In the showing of coil system 11 in FIG. 2, the tuning capacitors CT3 and CT1 are equal so that all loops of the coil system 11 are tuned for resonating responsive to proton signals.

Here again loop A is shown as being comprised of conductors 12, 13, 14 and 16. Loop B is shown as being comprised of the center conductor 17, part 14B of the transverse conductor 14, the first longitudinal conductor 12 and part 16B of the transverse conductor 16. Loop C includes the central conductor 17, the other part 14C of conductor 14, the second end conductor 13 and the other part 16C of conductor 16. The serially connected circuit elements that appeared in FIG. 1 are shown in FIG. 2.

The hybrid combiner comprises a pair of inductors L6 and L7 connected together at one end at point 28. Point 28 is connected to a preamplifier in the receiving system. A by-pass capacitor C1 connects point 28 to ground. The central conductor of coaxial cable 21 is shown connected to the free end 31 of coil L6. The central conductor of coaxial cable 22 is shown connected to the free end 32 of coil L7. A resistor R1 bridged by capacitor C2 is connected between points 31 and 32.

One of the coaxial cables 21 or 22, in this case shown as cable 21, has a quarter wave length section 36. This quarter wave length section assures that the coil acts as a quadrature coil. Thus the showing of coil 11 in FIG.

2 is when the coil is used for proton imaging only and as a quadrature surface coil.

While the quarter wave length section is shown in coaxial cable 21, whether it goes into cables 21 or 22 is determined experimentally by measurement of which location provides the highest peak resonance.

Figure 3:
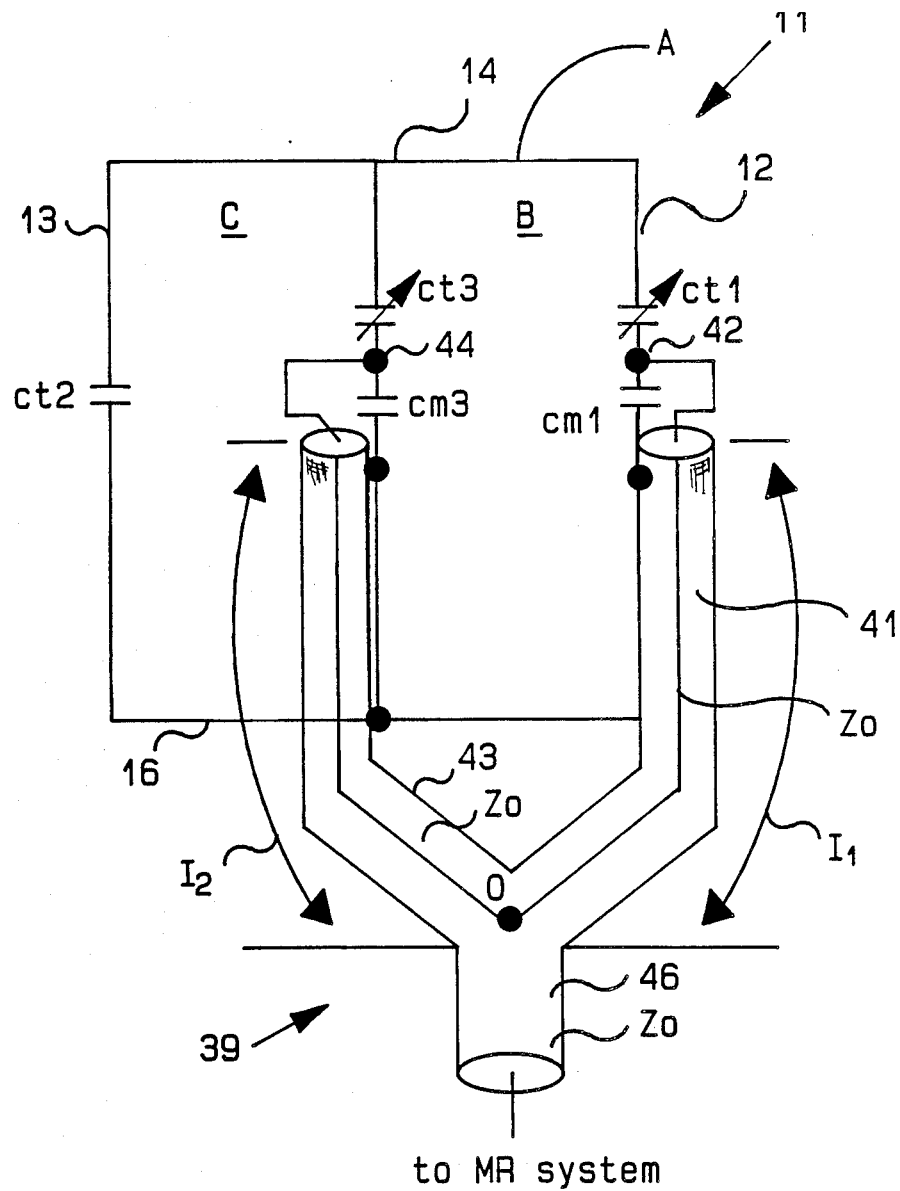
FIG. 3 is a schematic showing of the basic surface coil connected to the MR system through a unique coil coupling device.

FIG. 3 shows coil system 11 connected for acquiring data of protons or of other isotopes such as phosphor, sodium or carbon. The coil system is basically the same except for the coaxial cables connected to the coil system.

A unique coaxial cable combiner 39 is shown. The coaxial cable combiner 39 comprises a branch 41 which is coupled to coil system A by having the central conductor thereof connected at a junction point 42 of tuning capacitor CT1 and matching capacitor CM1. Then the shield of coaxial cable branch 41 is connected to the other side of matching capacitor CM1. The other branch 43 of the generally Y-shaped coaxial cable is coupled to loop B (and C) by having its central conductor connected to the junction of tuning capacitor CT3 and matching capacitor CM3 at point 44. The shielding of branch 43 is connected to the other side of matching capacitor CM3. The two branches join and become a single coaxial cable section 46. However the length of the two branches are different. Branch 41 has a length l1 and branch 43 is shown as having a length l2. The lengths are determined experimentally.

The capacitor CT1 tunes coil A to the resonant frequency of protons. The capacitor CT3 is used to tune coil B to the resonante frequency of the other isotope being examined. The matching capacitors are also selected at this time to match the impedance of the system. Thus the impedance of branch 41 is the system impedance Zo (in a preferred embodiment 50 ohms). Similarly, the impedance of branch 43 is also Zo and the impedance of section 46 is also Zo. The central conductors of branches 41 and 43 are connected together at junction point O. The length l2 is varied until the impedance of the coil B reflected at point O at the frequency of protons is infinite. The length l1 is then varied until the impedance of loop A reflected at junction point O at the frequency of sodium, for example, is infinite.

When length l1 and l2 are proper lengths then the coil can be used for detecting signals from proton or another isotope have lower resonances without further adjustment of the lengths of the cable branches.

In operation a surface coil arrangement is provided that can be used as a linear surface coil or a quadrature surface coil. The surface coil can also be used to measure FIDs generated by protons or other selective isotopes.

While the invention has been described using certain embodiments, it should be understood that these embodiments are exemplary only and are not designed to limit the scope of the invention.

What is claimed is:

1. A surface coil for use in a magnetic resonance (MR) system, said coil comprising:
    a first loop, said first loop comprising:
    first and second longitudinal substantially parallel conductors,
    a pair of transverse conductors coupled to the first and second longitudinal conductors at spaced apart points thereon to form said first loop,
    first means in the first loop for tuning and matching the loop to a first desired resonant frequency and to the system impedance,
    a second and a third loop comprising a third longitudinal conductor connected between substantially equal voltage points on said pair of transverse conductors, and
    second means for tuning and matching said second and third loops including said third longitudinal conductor to a second desired resonant frequency and to the system impedance.

2. The surface coil of claim 1 wherein said first means for tuning and matching the first loop to its first desired frequency comprises
    a first capacitor for tuning said first loop to resonance connected to a first matching capacitor; and, wherein:
    the second means for tuning and matching comprises a second capacitor for tuning said second and third loops including said third longitudinal conductor to resonance connected to a second matching capacitor and said third longitudinal conductor.

3. The surface coil of claim 2 including means for serially connecting said second capacitor for tuning in said second longitudinal conductor.

4. The surface coil of claim 3 including means for coupling for said surface coil to said MR system.

5. The surface coil of claim 4 wherein said means for coupling comprises a first coaxial cable having a center conductor and a shield,
    means for coupling the center conductor to the junction point of the first capacitor for tuning the first loop and the first matching capacitor,
    means for connecting the shield of the coaxial cable to the other side of the first matching capacitor,
    a second coaxial cable having a center conductor and a shield,
    means for coupling the center conductor of the second coaxial cable to the junction point of said second matching capacitor and said second capacitor for tuning located in the third longitudinal conductor, and, means for connecting the shielding of the second coaxial cable to the other side of the second matching capacitor.

6. The surface coil of claim 4 wherein said means for coupling said coil to said MRI system comprises hybrid combiner means, including means for producing a phase delay between the output of the first loop and the outputs of said second and third loops.

7. The surface coil of claim 6 wherein said means for introducing a phase delay comprises a length of coaxial cable equivalent to a quarter wave length section at the resonant frequency of the loop, said quarter wave length section being selectively serially connected to the first or second coaxial cable responsive to which of said first or second coaxial cable provides a higher peak at resonance.

8. The surface coil of claim 4 wherein said means for coupling said coil to said MRI system comprises:
    coaxial cable combiner means, said coaxial cable combiner means, comprising:
    a "Y" section of coaxial cable have a center conductor and outer shielding and comprised of a first branch, a second branch and a stem section,
    means for coupling said first branch to said first loop including means for connecting the center conductor of the first branch to the junction point of said first capacitor for tuning and said first matching capacitor, means for connecting the shielding of said first branch to the other side of said first matching capacitor, said means for connecting the second branch to said second and third loop comprising means for connecting the center conductor of said second branch to the junction point of said tuning capacitor for tuning and said second matching capacitor, means for coupling the shielding of said second branch to the other side of said second matching capacitor, and means for connecting the center conductors of both branches to the center conductor of the stem section.

9. The surface coil of claim 8 wherein the length of said first branch and the length of said second branch are unequal and said lengths of said first and second branches being determined by the length necessary to obtain an infinite reflection impedance in the center conductor of the stem section at resonant frequencies of the loops in the center conductor of the stem section.

* * * * *